US007924024B2

(12) United States Patent
Martens et al.

(10) Patent No.: US 7,924,024 B2
(45) Date of Patent: Apr. 12, 2011

(54) AUTOMATIC CALIBRATION TECHNIQUES WITH IMPROVED ACCURACY AND LOWER COMPLEXITY FOR HIGH FREQUENCY VECTOR NETWORK ANALYZERS

(75) Inventors: Jon S. Martens, San Jose, CA (US); Alexander Feldman, San Jose, CA (US)

(73) Assignee: Anritsu Company, Morgan Hill, CA (US)

( * ) Notice: Subject to any disclaimer, the term of this patent is extended or adjusted under 35 U.S.C. 154(b) by 513 days.

(21) Appl. No.: 12/024,916

(22) Filed: Feb. 1, 2008

(65) Prior Publication Data

US 2008/0197858 A1  Aug. 21, 2008

Related U.S. Application Data

(60) Provisional application No. 60/902,272, filed on Feb. 20, 2007.

(51) Int. Cl.
G01R 27/28 (2006.01)
G01R 11/32 (2006.01)

(52) U.S. Cl. ........................... 324/601; 324/650

(58) Field of Classification Search .................. 324/601, 324/650, 202, 74
See application file for complete search history.

(56) References Cited

U.S. PATENT DOCUMENTS

| 5,548,538 A | 8/1996 | Grace et al. | |
|---|---|---|---|
| 5,552,714 A * | 9/1996 | Adamian et al. | 324/601 |
| 5,578,932 A * | 11/1996 | Adamian | 324/601 |
| 5,587,934 A | 12/1996 | Oldfield et al. | |
| 6,914,436 B2 | 7/2005 | Liu et al. | |
| 7,054,776 B2 | 5/2006 | Bradley et al. | |
| 7,068,046 B2 | 6/2006 | Martens et al. | |
| 7,157,918 B2 | 1/2007 | Adamian | |

OTHER PUBLICATIONS

"Broadening the Shunt PIN Diode SPDT Switch," Application Note 957-1, Copyright 1999, Agilent Technologies, Inc.
"Switch Design," http://www.microwaves101.com/encyclopedia/switch_design.cfm, Mar. 19, 2006.

(Continued)

*Primary Examiner* — Timothy J Dole
*Assistant Examiner* — Farhana Hoque
(74) *Attorney, Agent, or Firm* — Fliesler Meyer LLP

(57) ABSTRACT

A calibration module, for use in calibrating a VNA, includes ports connectable to the VNA, calibration standards, and single pole multi throw (SPMT) switches. Each SPMT includes a single pole terminal, multiple throw terminals and a shunt terminal corresponding to each multiple throw terminal. A switching path is between each throw terminal and the single pole terminal, and between each shunt terminal and the single pole terminal. Each switching path includes at least one solid state switching element. The calibration standards are selectively connectable to the ports of the calibration module by selectively controlling the switching elements. Each port of the calibration module is directly connected to a throw terminal of one of the SPMT switches. Also, unique algorithm are provided for calibrating a VNA when using a calibration impedance that is a hybrid of a reflect standard and a transmission standard, which can be achieved using the calibration module.

20 Claims, 7 Drawing Sheets

OTHER PUBLICATIONS

Engen et al., "The Multi-State Two-port: An Alternative Transfer Standard," National Institute of Standards and Technology, 43rd ARFTG Conference Digest, vol. 25, May 1994, pp. 11-18.

Kobayashi and Kawai, "A Capacitive RF MEMS Shunt Switch," Murata Manufacturing Co., Ltd., 2nd Intl. Symp. on Acoustic Wave Devices for Future Mobile Communication Systems, Mar. 2, 2004.

Salter et al., "Over-Determined Calibration Schemes for RF Network Analysers Employing Generalised Distanced Regression," 62nd ARFTG Microwave Measurements Conference, Dec. 4-5, 2003, pp. 127-142.

Williams et al., "An Optimal Multiline TRL Calibration Algorithm," IEEE MTT-S Digest 2003, pp. 1819-1822.

Williams et al., "An Optimal Vector-Network-Analyzer Calibration Algorithm," IEEE Transactions on Microwave Theory and Techniques, vol. 51, No. 12, Dec. 2003, pp. 2391-2401.

Wong, "Electronic and Other Industrial Calibrations and Error Analysis," Agilent Technologies, Jun. 9, 2003.

* cited by examiner

AUTOMATIC CALIBRATION TECHNIQUES WITH IMPROVED ACCURACY AND LOWER COMPLEXITY FOR HIGH FREQUENCY VECTOR NETWORK ANALYZERS

PRIORITY CLAIM

This application claims priority under 35 U.S.C. 119(e) to U.S. Provisional Patent Application No. 60/902,272, filed Feb. 20, 2007, which is incorporated herein by reference.

FIELD OF THE INVENTION

The present invention relates to methods and devices for calibrating vector network analyzers (VNAs).

BACKGROUND

Automatic calibration techniques and devices (also referred to as modules) are increasingly in demand for high frequency Vector Network Analyzers (VNAs) due to the reduction in operator errors, the reduced care and maintenance required of the calibration standards, and the potential for accuracy enhancement (due to issues with manual standards and procedures at higher frequencies). Most attempts at autocalibration modules rely on some switching of standards to be presented to the VNA. The measurements of these standards, coupled with previously known characterization data about these standards, allow a high quality calibration to be transferred to the VNA in question. At higher frequencies, the switches become lossier and more burdened with parasitics that make it difficult to render a set of standards that are sufficiently different for a good transfer calibration. Some approaches have used electromechanical switching structures with lower loss but these are not very repeatable and can lead to very slow and less accurate measurements. Some approaches use monolithic microwave integrated circuits (MMIC) structures to efficiently generate these standards but at a very high startup cost and with limited flexibility for future changes.

Most VNA automatic calibration schemes are based on the concept of a transfer calibration, e.g., as described in G. F. Engen, R. Judish, and J. Juroshek, "*The multi-state two-port: an alternative transfer standard,*" *Proc. of 43rd ARFTG meeting*, pp. 11-18, June 1994, which is incorporated by reference herein. The automatic calibration device represents some stable set of states, that when combined with some knowledge about these states (derived from a metrological grade calibration performed once), provides enough information to reproduce the metrology-grade calibration on another instrument (with some non-zero amount of degradation). The 'knowledge' mentioned above is merely measurements of all of the states of the automatic calibration device made using this good calibration. Typically the 'good' calibration is performed by the manufacturer of the automatic calibration device and is performed under tightly controlled, traceable conditions. Examples of automatic calibration devices that can be used to perform such 'good' calibrations are disclosed in the following patents, each of which is incorporated herein by reference: U.S. Pat. No. 5,548,538 to Grace et al., entitled "Internal Automatic Calibrator for Vector Network Analyzers"; U.S. Pat. No. 5,587,934, to Oldfield et al., entitled "Automatic VNA Calibration Apparatus"; and U.S. Pat. No. 5,552,714 to Adamian et al., entitled "Electronic Calibration Method and Apparatus".

Because of cascading measurement uncertainties, the replicated calibrations will never be quite as good as the original. This leads to the question of what should the states of the automatic calibration device be to minimize this difference. To understand this, it is useful to look at a calibration algorithm. Traditionally, the transfer process is based on calibrating each reflectometer separately and then processing the transmission terms. As the critical part for this argument is the reflectometer portion, that path will be followed in the discussion below.

To perform single reflectometer calibrations, the minimum number of reflection standards is three, as can be appreciated from Equation 1 (Eq. 1.) below.

$$\Gamma_{meas} = ed + \frac{et \cdot \Gamma_{act}}{1 - eps \cdot \Gamma_{act}} \quad \text{(Eq. 1)}$$

where the italicized terms represent unknown error terms describing the VNA to be calibrated (ed representing directivity, et representing reflection tracking, and eps representing source match), $\Gamma_{act}$ (or simply $\Gamma_a$) represents the reflection coefficient of the state as measured with the metro-grade calibration, and $\Gamma_{meas}$ (or simply $\Gamma_m$) represents the same reflection coefficient as measured by the uncalibrated VNA-under-test.

For three standards, this problem can be linearized into a system of equations that are summarize in Equation 2 (Eq. 2) below.

$$\begin{bmatrix} \Gamma_{a1} & 1 & -\Gamma_{a1}\Gamma_{m1} \\ \Gamma_{a2} & 1 & -\Gamma_{a2}\Gamma_{m2} \\ \Gamma_{a3} & 1 & -\Gamma_{a3}\Gamma_{m3} \end{bmatrix} \cdot \begin{bmatrix} x \\ y \\ z \end{bmatrix} = \begin{bmatrix} \Gamma_{m1} \\ \Gamma_{m2} \\ \Gamma_{m3} \end{bmatrix} \quad \text{(Eq. 2)}$$

where x, y, and z are combinations of the previous italicized unknowns.

In Equation 2, the coefficient matrix on the left is of more concern. Evaluating its determinant leads to $\Gamma_{a2}\Gamma_{a3}\Gamma_{m3} - \Gamma_{a2}\Gamma_{a3}\Gamma_{m2} - \Gamma_{a1}\Gamma_{a3}\Gamma_{m3} + \Gamma_{a1}\Gamma_{a3}\Gamma_{m1} +$
$\Gamma_{a1}\Gamma_{a2}\Gamma_{m2} - \Gamma_{a1}\Gamma_{a2}\Gamma_{m1} = \Gamma_{m2}\Gamma_{a2}(\Gamma_{a1} - \Gamma_{a3}) -$
$\Gamma_{m1}\Gamma_{a1}(\Gamma_{a2} - \Gamma_{a3}) + \Gamma_{m3}\Gamma_{a3}(\Gamma_{a2} - \Gamma_{a1})$ If two standards have the same reflection coefficient ($\Gamma_{ax} = \Gamma_{ay}$, thus forcing $\Gamma_{mx} = \Gamma_{my}$), the determinant vanishes thus leaving the problem insoluble. If two of the standards are even close (relative to measurement uncertainty), then the high sensitivity of the system will make the measurement practically useless (a small variation in trace noise leads to a wild variation in the calibration of the target VNA). This follows from the classical problem of solving a system of equations with a determinant near zero. This concept of sufficient separation of states is important and drives the design of transfer methods at higher frequencies.

In higher frequency switching structures, it is difficult to minimize losses and switch parasitics. PIN diodes, which are typically used in solid state versions of these structures, have losses that increase monotonically with frequency and a minimum capacitance (set by package and current technology) that perturb higher frequency performance. The bias circuitry for these diodes adds additional RF loss and mismatch. Also, since it takes very little physical size to create a large electrical length at frequencies above 40 GHz, the state reflection coefficients will move rapidly with frequency. These factors together lead to the problem that it is hard to keep three states sufficiently distinct at all frequencies (in a broadband system).

This leads to the concept of overdetermined calibrations where more than 3 states are provided and a M row version of Equation 2 is generated, as shown in Equation 3 (Eq. 3) below. Such a concept is described in part in an article entitled "An optimal multiline TRL calibration algorithm," by D. F. Williams et al, IEEE MTT-S Digest, June 2003, pp. 1819-1822, which is incorporated herein by reference. As described in this article, this concept, can be solved using a simple least-squares approach (the best solution will be found in the sense that errors for the various constituent equations are minimized in a least squares sense) or through other techniques such as orthogonal distance regression. Orthogonal distance regression is described in an article entitled, "Over-determined calibration schemes for RF network analyzers employing generalised distance regression," by M. Salter et al., Proc. of 62nd ARFTG meeting, December 2003, pp. 127-142, which is incorporated herein by reference. In either case, a solution for x, y and z is found that is 'best' in some sense and from this, the classical error terms for directivity (ed), source match (eps), and reflection tracking (et) can be easily found.

$$\begin{bmatrix} \Gamma_{a1} & 1 & -\Gamma_{a1}\Gamma_{m1} \\ \Gamma_{a2} & 1 & -\Gamma_{a2}\Gamma_{m2} \\ \vdots & \vdots & \vdots \\ \Gamma_{am} & 1 & -\Gamma_{am}\Gamma_{mn} \end{bmatrix} \cdot \begin{bmatrix} x \\ y \\ z \end{bmatrix} = \begin{bmatrix} \Gamma_{m1} \\ \Gamma_{m2} \\ \vdots \\ \Gamma_{mn} \end{bmatrix} \quad \text{(Eq. 3)}$$

An additional modification than can be employed in this search for the 'best' solution is to weight the results based on some estimate of the uncertainty in the characterization values (or the measurements themselves), as described in an article entitled "Electronic and other industrial calibrations and error analysis," by K. Wong, presented at IEEE MTT-S workshop WMK: Measurement Uncertainty for Network Analysis: State of the Art and New Directions, Philadelphia, Pa., June 2003, which is incorporated herein by reference. This can be done by simply scaling the equations by uncertainties $U_1, \ldots, U_m$, as shown in Equation 4 (Eq. 4) below.

$$\begin{bmatrix} \Gamma_{a1}/U_1 & 1/U_1 & -\Gamma_{a1}\Gamma_{m1}/U_1 \\ \Gamma_{a2}/U_2 & 1/U_2 & -\Gamma_{a2}\Gamma_{m2}/U_2 \\ \vdots & \vdots & \vdots \\ \Gamma_{am}/U_m & 1/U_m & -\Gamma_{am}\Gamma_{mn}/U_m \end{bmatrix} \cdot \begin{bmatrix} x \\ y \\ z \end{bmatrix} = \begin{bmatrix} \Gamma_{m1}/U_1 \\ \Gamma_{m2}/U_2 \\ \vdots \\ \Gamma_{mn}/U_m \end{bmatrix} \quad \text{(Eq. 4)}$$

While a variety of lower frequency automatic calibration devices exist, these are not readily extensible to higher frequency work for the reasons mentioned above.

One high frequency apparatus and technique for calibrating a VNA is embodied in the Anristu model 36582KKF electromechanical autocalibration module, sold by Anritsu Company, Morgan Hill, Calif. While the three reflect states can be kept reasonably separate (very low loss in this switch type), it does suffer from repeatability issues inherent in electromechanical switches. Switch averaging schemes should be employed, but even with these, there is some accuracy degradation. Other potential issues are the slow speed and limited switch lifetime inherent in electromechanical designs.

A second alternative is to create the required switching and standards within an integrated circuit, as described in U.S. Pat. No. 6,914,436 to Liu et al., entitled "Electronic Calibration Circuit for Calibrating a Network Analyzer," which is incorporated herein by reference. While this alternative significantly reduces the switch parasitics and electrical size of the structure, the engineering cost is very high, as are structural startup costs. Additionally, with this alternative reconfigurability is not possible without an entire new mask set and process run, which is very costly.

In both cases, multi-port versions have been envisioned (e.g., like the Anritsu 36584KF or similar). However, such multi-port versions typically just add an (N−1)-port switch in front of a 2-port automatic calibration structure. This can be appreciated from FIG. 1A, which shows an N-port VNA 101 (also known as a multi-port VNA) connected to a 2-port autocalibration module 100 using a single-pole N−1 throw switch 106. It is noted that the term multi-port, as used herein, refers to more than 2 ports. For example, a 2-port VNA is not a multi-port VNA, but a 4-port VNA is a multi-port VNA.

FIG. 1B illustrates exemplary details of a classical approach to an over-determined automatic calibration system having M standards, which can be used to implement the 2 port autocalibration module 100 of FIG. 1A. The system is referred to as an "over-determined" system because it uses more than the traditional three (open, load and short) calibration standards. For similar reasons to those mentioned above, here the M-throw switches 108 and 110 on each side can cause problems at high frequencies due to increasing losses and parasitics.

Accordingly, there is a desire to create a structure (operating from a few MHz or lower to beyond 50 GHz) with solid state switching and multiple standards, but still in a semi-discrete structure (separate switches from standards) to keep startup costs low and allow relatively quick reconfigurability.

SUMMARY

An embodiment of the present invention is directed to a calibration module for use in calibrating a VNA. The calibration module includes ports connectable to a VNA, calibration standards, and single pole multi throw (SPMT) switches. Each SPMT includes a single pole terminal, multiple throw terminals and a shunt terminal corresponding to each multiple throw terminal. A switching path is between each throw terminal and the single pole terminal, and between each shunt terminal and the single pole terminal. Each switching path includes at least one solid state switching element. The calibration standards are selectively connectable to the ports of the calibration module by selectively controlling the switching elements. Each port of the calibration module (connectable to a VNA) is directly connected to a throw terminal of one of the SPMT switches (rather than being directly connected to a single pole terminal, as was the case in FIG. 1B). Additionally, in accordance with an embodiment, the single pole terminal of each SPMT switch is connected internal to the calibration module (rather than being directly connected to a port of the calibration module, as was the case in FIG. 1B). The calibration module can also include a controller to control the switching elements, and to thereby control an automatic calibration procedure.

In accordance with an embodiment of the present invention, the single pole multi throw (SPMT) switches of the calibration module can be selectively controlled to thereby selectively provide transmission paths between calibration standards of the calibration module and one or more ports of the VNA being calibrated. A unique transmission path can be achieved by connecting at least one of the shunt terminals, of one of the SPMT switches, in a transmission path. Typically, shunt terminals are not used in this manner. Embodiments of the present invention are also directed to unique algorithms for calibrating a VNA when using a calibration impedance that is a hybrid of a reflect standard and a transmission standard. Such a hybrid standard can be achieved using the calibration module described above. In an embodiment, a calibration module is used to produce a plurality of different calibration impedances and a thru connection. At least one of the calibration impedances is a hybrid of a reflect standard and a transmission standard, which can be achieved by connecting a first port of the VNA to at least one calibration standard and a second port of the VNA (i.e., by using the calibration module to connect a first port of the VNA to a second port of the VNA and to at least one calibration standard). Calibration measurements are performed for the different calibration impedances and the thru connection, and values of calibration terms for the VNA are determined based on the calibration measurements.

In an embodiment, the calibration module is used to produce more than three different calibration impedances and the thru connection, and overdetermined calibration measurements are performed for the more than three different calibration impedances and the thru connection.

In an embodiment, values of calibration terms for the VNA can be determined by determining values for directivity, reflection and source match terms, and determining values for load match and transmission terms. Additionally, revised characterization values are determined for each calibration impedance that is a hybrid of a reflect standard and a transmission standard, and the above steps are repeated using the revised characterization values. This process can be repeated until error coefficients converge to a specified level, e.g., to within a predetermined tolerance.

In an embodiment, scaling equations are used to determine values for directivity, reflection and source match terms. The scaling can be based on uncertainties, or based on relative proximity of calibration standards used to provide the calibration impedances.

In an embodiment, the following equations are used to determine the revised characterization values for each calibration impedance that is a hybrid of a reflect standard and a transmission standard:

$$S_{11}^{cc} = S_{11}^{c} + \frac{S_{21}^{c} \cdot S_{12}^{c} \cdot ep2L}{1 - S_{22}^{c} \cdot ep2L}$$

$$S_{22}^{cc} = S_{22}^{c} + \frac{S_{21}^{c} \cdot S_{12}^{c} \cdot ep1L}{1 - S_{11}^{c} \cdot ep1L}$$

where, the 'cc' superscripts denote the revised characterization values, the 'c' superscripts denote characterization values measured with a parent calibration in place, the S-parameters correspond to the thru connection, and the ep1L and ep2L are values for load match terms that have been determined.

This summary is not intended to be a complete description of the invention. Other features, aspects, objects and advantages of the invention can be obtained from a review of the specification, the figures, and the claims.

DETAILED DESCRIPTION

As mentioned above, there is a desire to create a structure (operating from a few MHz or lower to beyond 50 GHz) with solid state switching and multiple standards but still in a semi-discrete structure (separate switches from standards) to keep startup costs low and allow relatively quick reconfigurability. A first attempt would be to create an M+1 port switch 106 at each of the N ports shown in FIG. 1A, where the M reflect standards could be quickly generated. It has been determined that M of at least 5 is desirable, as described in an article entitled "Over-determined calibration schemes for RF network analyzers employing generalised distance regression," by M. Salter et al., Proc. of 62nd ARFTG meeting, pp. 127-142, December 2003, which is incorporated herein by reference. Depending on the separation of standards, there may be diminishing returns after somewhere between 6 and 10 standards. However, it has been found that with current switching technology, even a 4 pole switch has parasitic problems at the higher frequencies. Also, the resulting standards suffer enough loss that there are certain frequencies at which all of the standards are too close together. Using multiple layers of simpler switches (e.g., single pole double throw switches) would be even worse in that losses would be similar and the electrical length would get larger (the space required for biasing structures of additional switches is quite large), leading to even more overlap of standards.

Figure 2A:
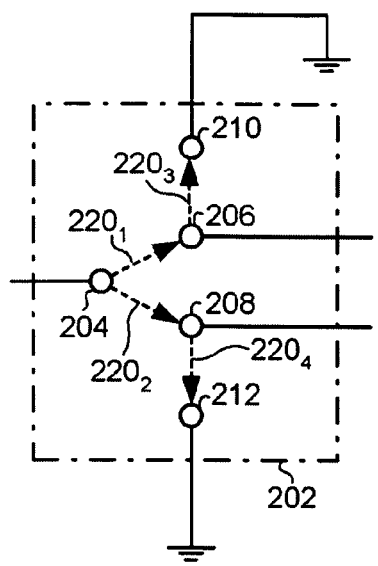
FIG. 2A illustrates details of an exemplary single pole double throw (SPDT) switch.

Before explaining details of the present invention, it is first useful to describe details of an exemplary single pole double throw (SPDT) switch. Referring to FIG. 2A, an exemplary SPDT switch 202 includes a single pole terminal 204 (also known as a common node) and two throw terminals 206 and 208. Additionally, the SPDT switch 202 includes two shunt terminals 210 and 212. Between the pole terminal 204 and each throw terminal 206 and 208, and between each throw terminal 206 and 208 and its respective shunt terminal 210 and 212 is a switching path $220_n$. Each switching path $220_n$ includes least one solid state switching element, e.g., a PIN diode, FET, Schottky diode, or the like, that can be independently opened or closed using appropriate biasing. For example, between the common node terminal 204 and throw terminal 206 is a switching path $220_1$; between the common node terminal 204 and the throw terminal 208 is switching path $220_2$; between the throw terminal 206 and the shunt terminal 210 is switching path $220_3$; and between the throw terminal 208 and the shunt terminal 212 is switching path $220_4$. Typically, each shunt terminal is connected directly (or through a resistor) to ground. Typically, the switching path between a throw terminal and a shunt terminal is closed when that throw terminal is not connected to the common node terminal, to sink to ground any leakage current between the common node terminal and the throw terminal. As will be appreciated from the discussion below, such shunt terminals are used in a different manner in specific embodiments of the present invention.

Figure 2B:
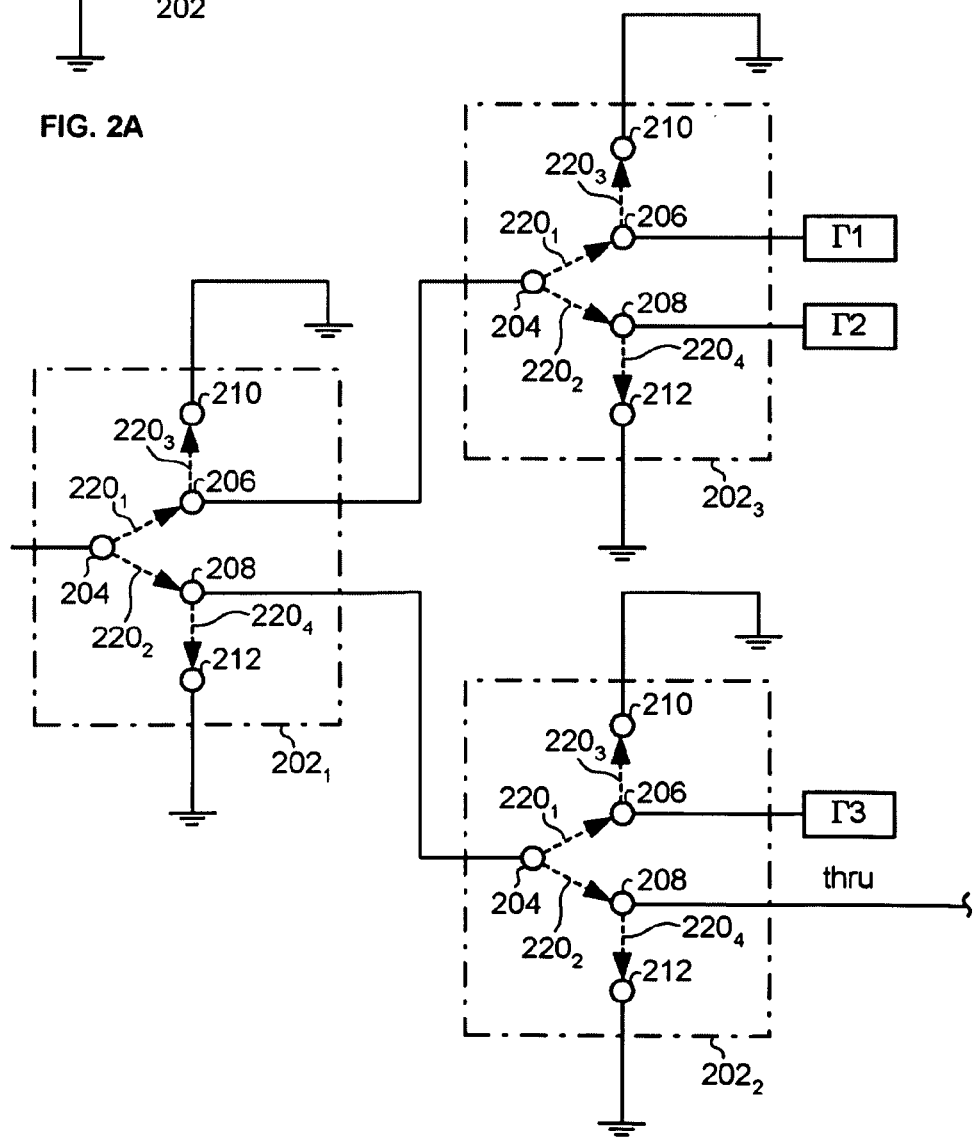
FIG. 2B illustrates how three SPDT switches of FIG. 2A can be layered to produce a four throw switch.

FIG. 2B illustrates how multiple layers of SPDT switches 202 are often used to create a switch having more throws (four throws in this example). Such layering is often used because the parasitics in switches having more than two throws are often too high to be used. Nevertheless, the parasitics produced when layering multiple SPDT switches are also higher than desired. Embodiments of the present invention reduce such parasitics by using simple switches, such as SPDT switches, in a different manner.

Figure 3:
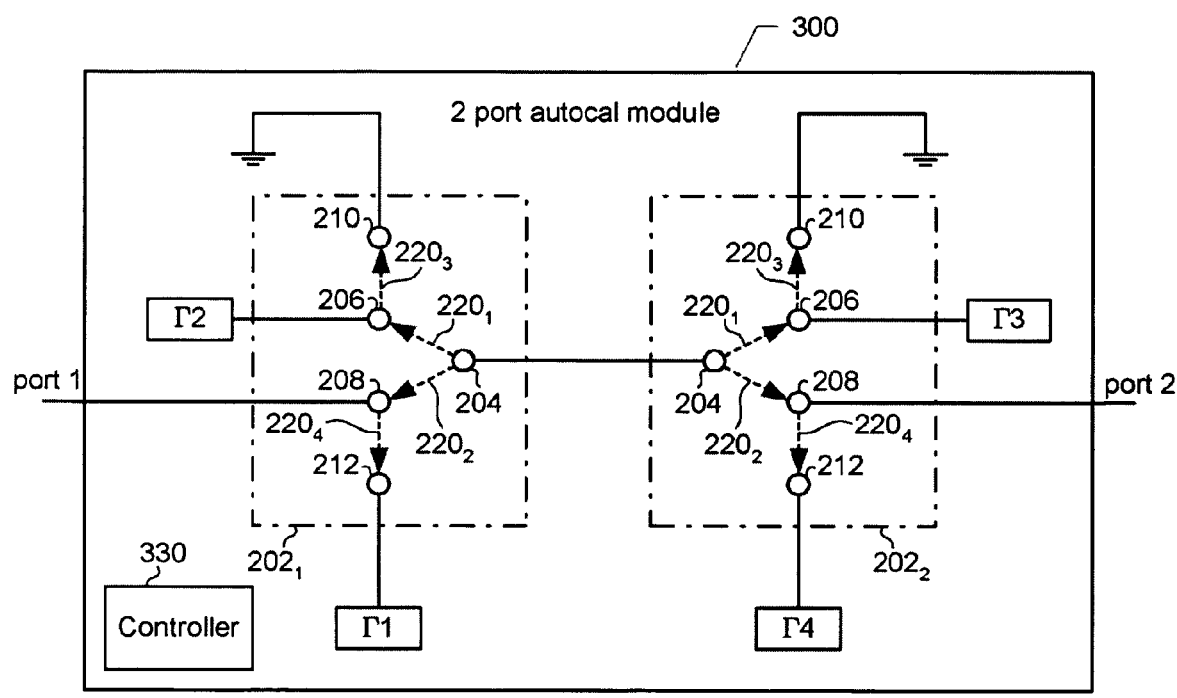
FIG. 3 illustrates a 2-port autocalibration module, according to specific embodiments of the present invention.

In accordance with specific embodiments of the present invention, a multiplexing-like structure uses simpler switches in a single layer per port. The simpler switches are preferably SPDT switches, but potentially single pole triple throw (SP3T) or higher can be used as those switch technologies improve. As shown in FIG. 3, a feature of specific embodiments of the present invention is to not use the common node (i.e., the single pole) of the switch for the calibration port, but rather to put the common node internal and to use all possible states of the switch (on-on, on-off, off-on, and off-off for SPDT). Another feature of specific embodiments of the present invention is that the shunt terminals of such solid-state switches, which are typically used to create a useful short-like RF impedance at each arm, can be used to produce one of the impedance states (e.g., shunt terminal 212 is used to produce an impedance state with Γ1 in FIG. 3).

Referring to FIG. 3, two SPDT switches $202_1$ and $202_2$ are connected such that the common node terminals 204 of the two switches $202_1$ and $202_2$ are not directly connected to a port of the calibration module 300, but rather are connected internal to the module 300 (and in this embodiment, to one another). Here, the shunt terminal 212 of the SPDT switch $202_1$ is connected to a calibration standard labeled Γ1, the throw terminal 206 is connected to a calibration standard labeled Γ2, and the other throw terminal 208 is connected to port 1 of the calibration module 204. Similarly, the shunt terminal 212 of the other SPDT switch $202_2$ is connected to a calibration standard labeled Γ4, the throw terminal 206 is connected to a calibration standard labeled Γ3, and the other throw terminal 208 is connected to port 2 of the calibration module 300.

Still referring to FIG. 3, five different calibration impedances (Z1-Z5) can be created as follows (from the point of view of port 1), with port 2 fully disconnected. In each of the following, if a switching path is not indicated as being closed, then it is presumed open.

Z1: close only the switching path $220_4$ between the throw terminal 208 and the shunt terminal 212 (of SPDT switch $202_1$), thereby connecting port 1 of the calibration module 300 to Γ1.

Z2: close the switching path $220_2$ between the throw terminal 208 and the common node terminal 204 (of SPDT switch $202_1$), and close the switching path terminal $220_1$ between the common node terminal 204 and the throw terminal 206 (of SPDT switch $202_1$), thereby connected port 1 of the calibration module 300 to Γ2.

Z3: only close the switching path $220_2$ between the throw switch terminal 208 and the common node terminal 204 (of SPDT switch $202_1$), thereby connecting port 1 to an open stub.

Z4: close the switching path $220_2$ between the throw switch terminal 208 and the common node terminal 204 (of SPDT switch $202_1$), and close the switching path $220_1$ between the common node terminal 204 and the throw switch terminal 206 (of SPDT switch $202_2$), thereby connecting port 1 of the calibration module 300 to Γ3.

Z5: close the switching path $220_2$ between the throw terminal 208 and the common node terminal 204 (of SPDT switch $202_1$), close the switching path terminal $220_1$ between the common node terminal 204 and the throw terminal 206 (of SPDT switch $202_1$), and also close the switching path $220_1$ between the common node terminal 204 and the throw switch terminal 206 (of SPDT switch $202_2$), thereby connecting port 1 of the calibration module 300 to Γ2 and Γ3.

A useful concept presented above is the addition of a controlled impedance (with a practical minimum electrical length) attached to a single main switching node per port. The 'controlled' in this sense is the selection of shunts that produce distinct impedances at the port for a wide frequency range.

Another change is to allow the use of hybrid reflect-transmit structures (connecting shunt impedances to transmission paths) to generate additional calibration impedances. In the present implementation, 5 reflect-like calibration impedances are available with port 2 fully disconnected (as explained above), and 8 calibration impedances (i.e., 3 additional calibration impedances) are available with full port connection (i.e., by also connecting in port 2).

This concept can be generalized to include a few additional single pole single throw (SPST) switches (and additional shunt impedances) to provide more calibration impedances with minimal electromagnetic disruption but they would likely be limited to keep the electrical size of the entire structure small.

The additional 3 calibration impedances (i.e., Z6, Z7 and Z8) are provided by configuring the switches $202_1$ and $202_2$ as explained above to achieve Z2, Z4, and Z5 above, but with the second port of the automatic calibration device 300 connected (i.e., by closing the switching path $220_2$ between the pole terminal 204 and the throw terminal 208 of the SPDT switch $202_2$). This places an addition shunt impedance (roughly 50 ohms, that of port 2 of the target VNA) at the end of an additional electrical length and some loss. In accordance with specific embodiments of the present invention discussed below, special handling of this additional shunt impedance is provided using an algorithm discussed below. These calibration impedances are thus a hybrid of classical reflect standards and transmission standards. Accordingly, they are sometimes referred to hereafter as hybrid reflect-transmit standards, or simply as hybrid standards. Generally, such a hybrid standard can be achieved by using a calibration module to connect a first port of a VNA to both a second port of the VNA and to at least one calibration standard. Preferably the transmission path between the first and second ports of the VNA, through the calibration module, is non-negligible so that error coefficients can be calculated.

Note that the Z3 calibration impedance above becomes the 'thru' standard by connecting port 2 of module 300 to pole 204 of the SPDT switch $202_2$ (i.e., by closing the switching path $220_2$ between the throw switch terminal 208 and the pole terminal 204 of SPDT switch $202_1$, and also closing the switching path $220_2$ between the pole terminal 204 and the throw terminal 208 of the SPDT switch $202_2$, thereby connecting port 1 to port 2).

Figure 4A:
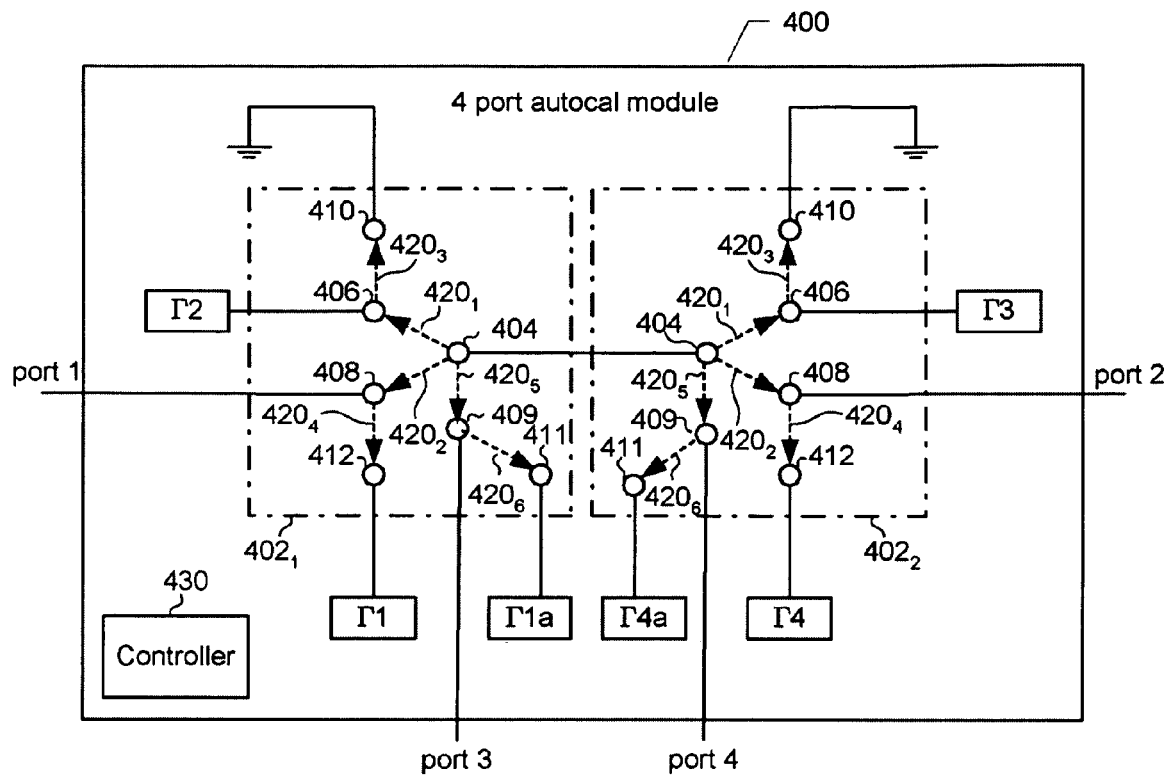
FIG. 4A illustrates a 4-port autocalibration module, according to specific embodiments of the present invention.

Another possibility using this topology is the simple construction of N-port calibration systems without the switch problems discussed with reference to FIGS. 1A and 1B. For example, by using single pole triple throw (SP3T) switches in place of SPDT switches, a 4 port calibration device is possible with no additional loss or parasitics (other than those inherent in the difference between a SPDT and a SP3T). An example is shown in FIG. 4A, which shows a calibration module 400 including SP3T switches 402$_1$ and 402$_2$. In the embodiment of FIG. 4A, the same 5 to 8 calibration impedances are available along with additional thru connections. If the basic switch technology allows, this process can be extended to even higher numbers of ports. Note that shunt terminals 410 in FIG. 4A (and shunt terminals 210 in FIG. 3) need not be connected to ground, as shown, but rather can connected to even further gamma calibration standards, to provide even more calibration states.

Figure 4B:
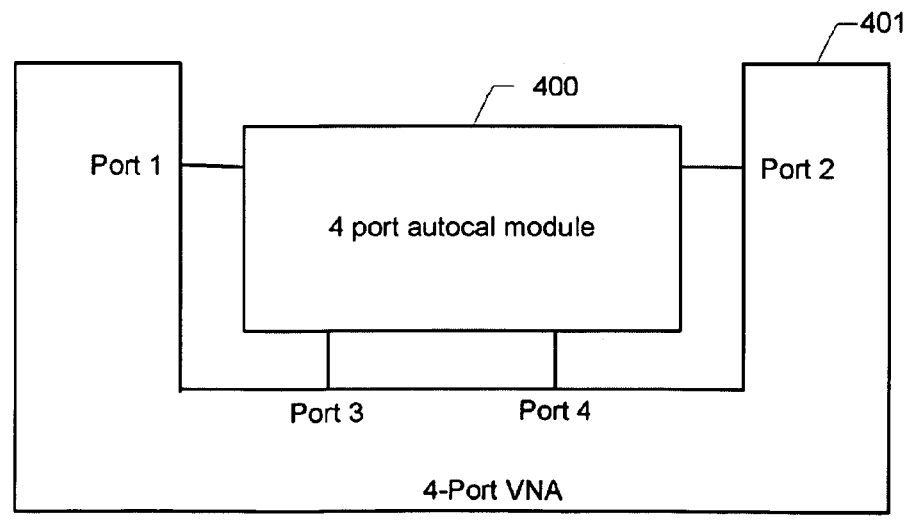
FIG. 4B illustrates how the 4-port autocalibration module of FIG. 4A can be connected to a 4-port VNA.

FIG. 4B illustrates that the 4-port autocalibration module 400 of FIG. 4A can be directly connected to a 4-port VNA 401, without the need for an additional SP3T switch between the VNA 401 and the module 400. In contrast, as was the case in FIG. 1A, a SP(N−1)T switch was required between the multi-port VNA 101 and the module 100.

A novel algorithmic approach is preferably used with the above described hybrid standards, since the reflect values become dependent on the load match of the target VNA, which is another variable to be solved for. Such an algorithmic approach is described below.

Figure 1A:
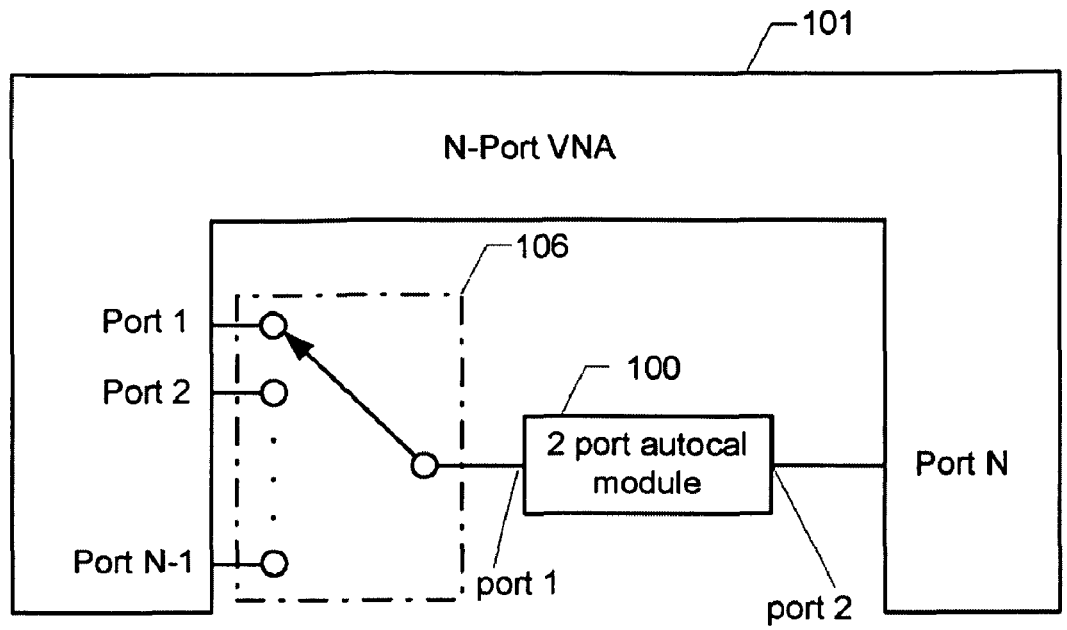
FIG. 1A shows a multi-port VNA connected to a 2-port autocalibration module using a single-pole N–1 throw switch.
Figure 1B:
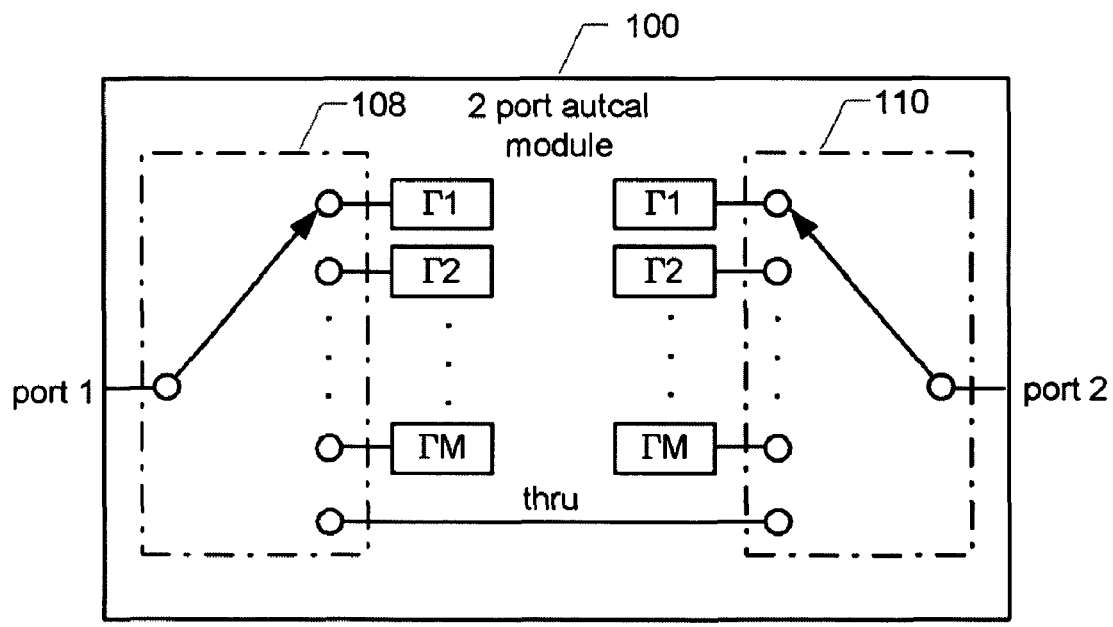
FIG. 1B illustrates exemplary details of a classical approach to an over-determined automatic calibration system having M standards, which can be used for the 2-port autocalibration module of FIG. 1A.

Conventionally, Equation 2 discussed above has been used to independently solve the reflectometer problem for ports 1 and 2 of a conventional 2-port calibration module (e.g., 100 of FIGS. 1A and 1B). This leads to measuring the thru standard, and using the Equations 5 (Eqs. 5) below to solve for transmission tracking and load match.

$$ep1L = \frac{(S_{22}^m - ed2) \cdot (S_{22}^c \cdot ep2S - 1) + S_{22}^c \cdot et22}{(S_{22}^m - ed2) \cdot (\Delta \cdot ep2S - S_{11}^c) + \Delta \cdot et22}$$ (Eqs. 5)

$$ep2L = \frac{(S_{11}^m - ed1) \cdot (S_{11}^c \cdot ep1S - 1) + S_{11}^c \cdot et11}{(S_{11}^m - ed1) \cdot (\Delta \cdot ep1S - S_{22}^c) + \Delta \cdot et11}$$

$$et21 = \frac{S_{12}^c \cdot S_{21}^m \cdot et11}{(S_{11}^m - ed1) \cdot (\Delta \cdot ep1S - S_{22}^c) + \Delta \cdot et11}$$

$$et12 = \frac{S_{21}^c \cdot S_{12}^m \cdot et22}{(S_{22}^m - ed2) \cdot (\Delta \cdot ep2S - S_{11}^c) + \Delta \cdot et22}$$

$$\Delta = S_{11}^c \cdot S_{22}^c - S_{21}^c \cdot S_{12}^c$$

Here the 'c' superscripts denote a characterization value (measured with the parent calibration in place) and the 'm' superscripts denote measured (raw) values acquired on the target VNA. The S-parameters here refer to those of the thru standard.

The previously found reflectometer terms (ed1, ed2, ep1S, ep2S, et11, and et22) are used in the above Equations 5. Transmission terms, including load match term (ep1L) and transmission tracking terms (et21 and et12) can be computed using Equation 2, discussed above. However, reflectometer terms, including directivity (ed2), source match (ep2s) and reflection tracking (et22) are computed using Equations 3 or 4 (and preferably, Equation 4). The port 2 load match (ep2L) is unknown, and is determined using an iterative process, in accordance with specific embodiments of the present invention. During the first iteration, an assumption for port 2 load match (ep2L) can be used, e.g., ep2L can be assumed to be zero (i.e., perfect), but that is arbitrary. It is also possible to omit the ep2L and ep1L terms during the first iteration, and then include these terms during later iterations once decent estimates for load matches are available.

Equation 6 (Eq. 6) below is next used to revise the characterization values for the hybrid reflect standards (i.e., $\Gamma_a$ values in Equation 4) using the new values of load match. This step is performed for each of the hybrid standards.

$$S_{11}^{cc} = S_{11}^c + \frac{S_{21}^c \cdot S_{12}^c \cdot ep2L}{1 - S_{22}^c \cdot ep2L}$$ (Eq. 6)

$$S_{22}^{cc} = S_{22}^c + \frac{S_{21}^c \cdot S_{12}^c \cdot ep1L}{1 - S_{11}^c \cdot ep1L}$$

Here the 'cc' superscript denotes the revised characterization values. Additional corrections are possible for the non-zero residual load match in the original calibration but these are usually inconsequential (depending on the hardware and the initial calibration).

More specifically, Equations 4 (or 3), 5 and 6 are repeatedly run through in a cycle, in that order. Equation 3 or 4 is first used to calculate ed1, et11, ep1S, ed2, ep2S, and et22 (x, y and z are combinations of these that can be separated). Equation 5 is then used to find ep1L, ep2L, et21, and et12. Equation 6 is used to revise the characterization values of some of the standards (the $\Gamma_a$ values in Equation 4). Then Equation 3 or 4 is run again with these new values, followed by Equations 5 and 6. This iterative processes can be repeated as often as needed for the error coefficients to converge.

Equation 3 is less computationally intensive than Equation 4. Thus, if there aren't frequencies where the standards will be too close together on the Smith chart, it may be preferred to simply use Equation 3. However, the weighting of Equation 4 is advantageous where the standards become too close together on the Smith chart at certain frequencies. Further, where the weightings are close to one another Equation 4 will become similar to Equation 3 (e.g., where the weighting are identical Equation 4 reduces to Equation 3), and thus not be worth the computation cost. While some known uncertainties could be used for scaling as discussed before, it may be difficult or time consuming to arrive at these for the standards in the automatic calibration module. Since the standards themselves are roughly equally stable (aside from the transmission standards which have some load match dependency which is corrected for as discussed above) and the signal-to-noise ratio is not usually tested by the reflection coefficients involved, it may be better to weight based on standards proximity. More specifically, in accordance with specific embodiments of the present invention, at each frequency, the standards are sorted based on maximal distance on a Smith chart from the other standards. The combination of 4 standards that result in the greatest summed distance (different standards counts and different metrics could be used) are given a weight of $U_i=1$. The remaining standards are given a weight between $U_i=2$ and $U_i=10$ (other weights could be used, but the important point is that the $U_i$ are relative on a multiplicative basis) depending on their proximity to one of the standards in the first group of 4.

An automatic calibration structure, like that described above with reference to FIG. 3, has been constructed for measurements to 67 GHz. It was used with the unique transfer process algorithms described above to calibrate a target VNA. The measurements with that newly calibrated VNA (on several test devices) were then compared against the same measurements made using the original (characterization) calibration. In all cases, the dotted trace (502, 602 and 702) represents the data acquired using the base calibration and the solid line (504, 604 and 704) represents that from the automatic calibration process of embodiments of the present invention. The results are shown here for a high pass filter test devices, but similar results could be obtained with other devices.

Figure 5A:
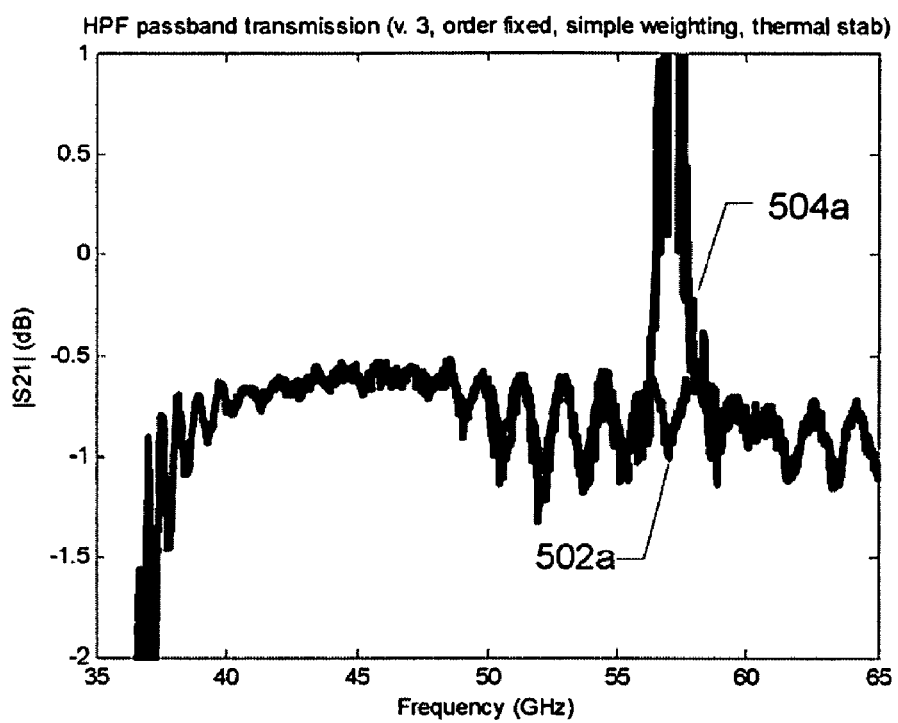
FIGS. 5A and 5B show S11 and S22 results that can be achieved using a 3-standard automatic calibration, as compared to a base calibration.
Figure 5B:
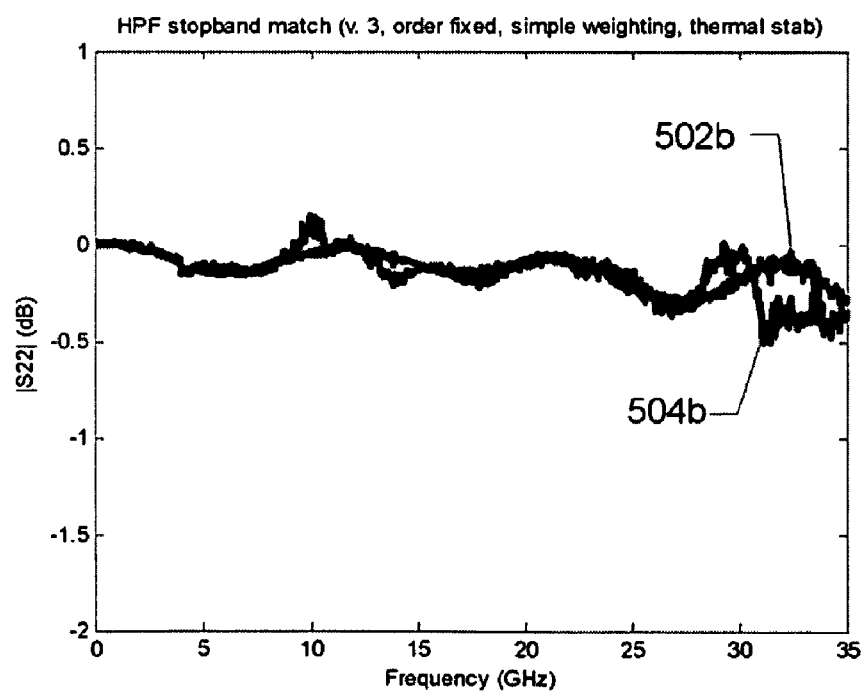

In the first measurement comparison, there was an attempt to use only 3 standards. The results (FIGS. 5A and 5B) do not show good agreement between the base calibration acquired data 502 and the transfer calibration acquired data 504 in the range of frequencies between 50 and 60 GHz for S21 in FIG. 5A, and between 27 and 35 GHZ for S22 in FIG. 5B. It turns out that at these frequency ranges the standards become closest together on the Smith chart, so it is somewhat logical that this is a problem area.

Figure 6A:
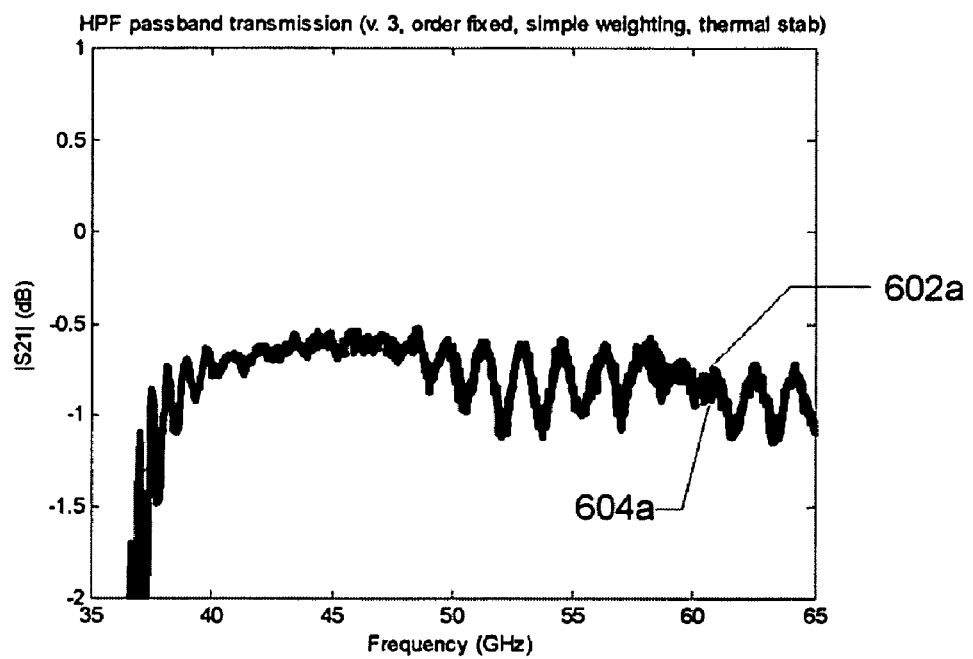
FIGS. 6A and 6B show S11 and S22 results that can be achieved using an overdetermined automatic calibration with equal weighting for various standards used, as compared to a base calibration.
Figure 6B:
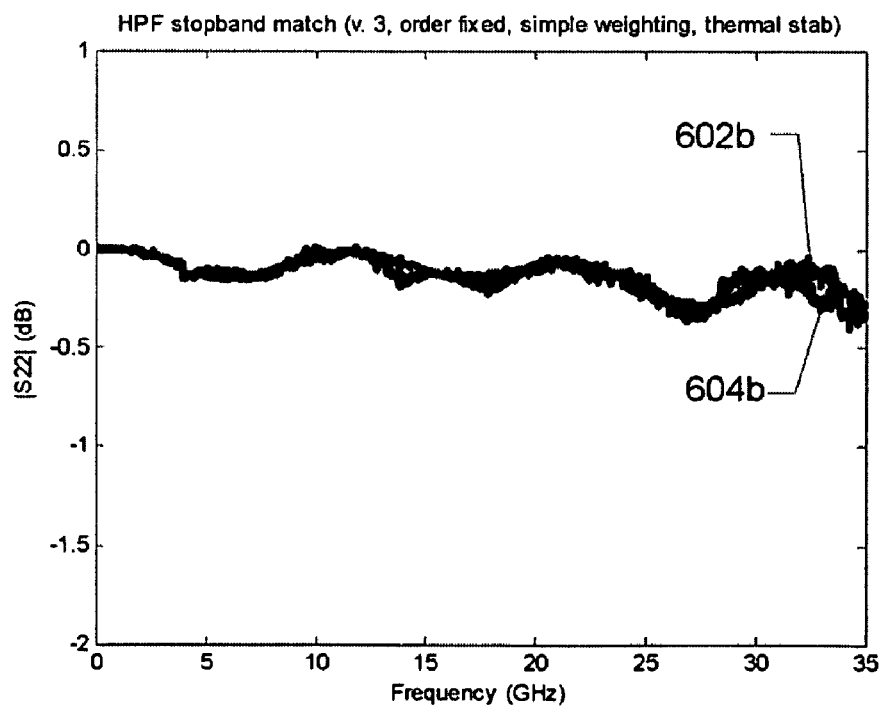

Next, a comparison was done with the overdetermined system of standards using the structure of FIG. 3, and a preliminary algorithm with equal weighting. These results (FIGS. 6A and 6B) show much better agreement than in FIGS. 5A and 5B, but still with some slight deviations (e.g., S22 between 30 and 35 GHz). In other words, $U_1$ through $U_m$ in Equation 4 were all equal, which makes Equation 4 essentially the same as Equation 3. In FIGS. 6A and 6B, the curves 602 shows base calibration acquired data, and the curves 604 show the transfer calibration data acquired using embodiments of the present invention.

Figure 7A:
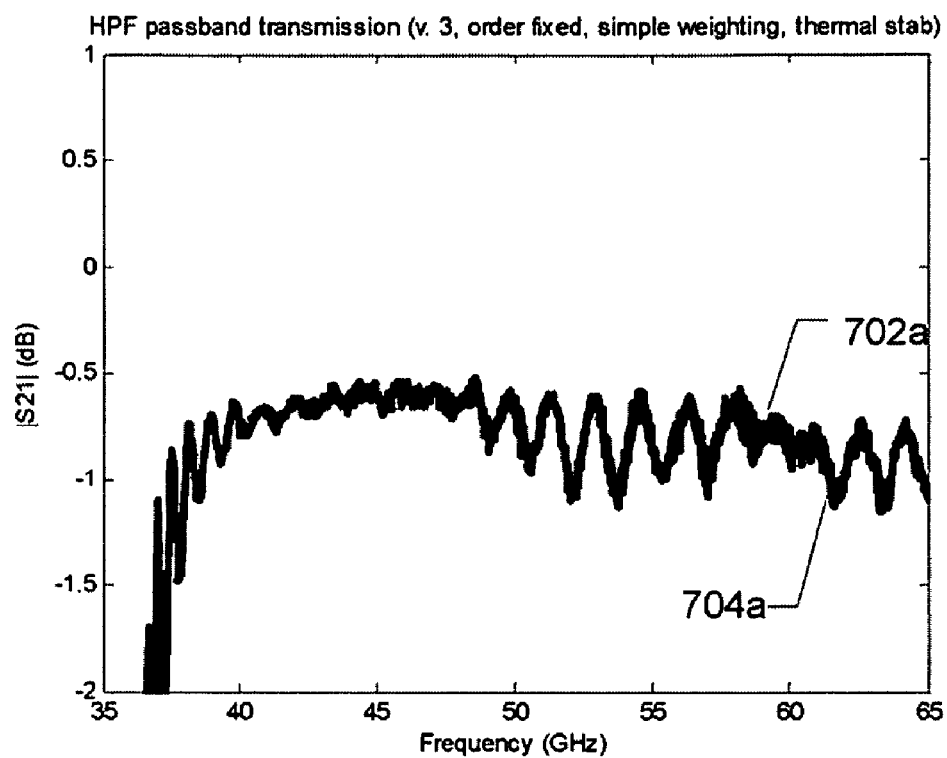
FIGS. 7A and 7B show S11 and S22 results that can be achieved using an overdetermined automatic calibration with proximity-based weighting for the various standards used, as compared to a base calibration.
Figure 7B:
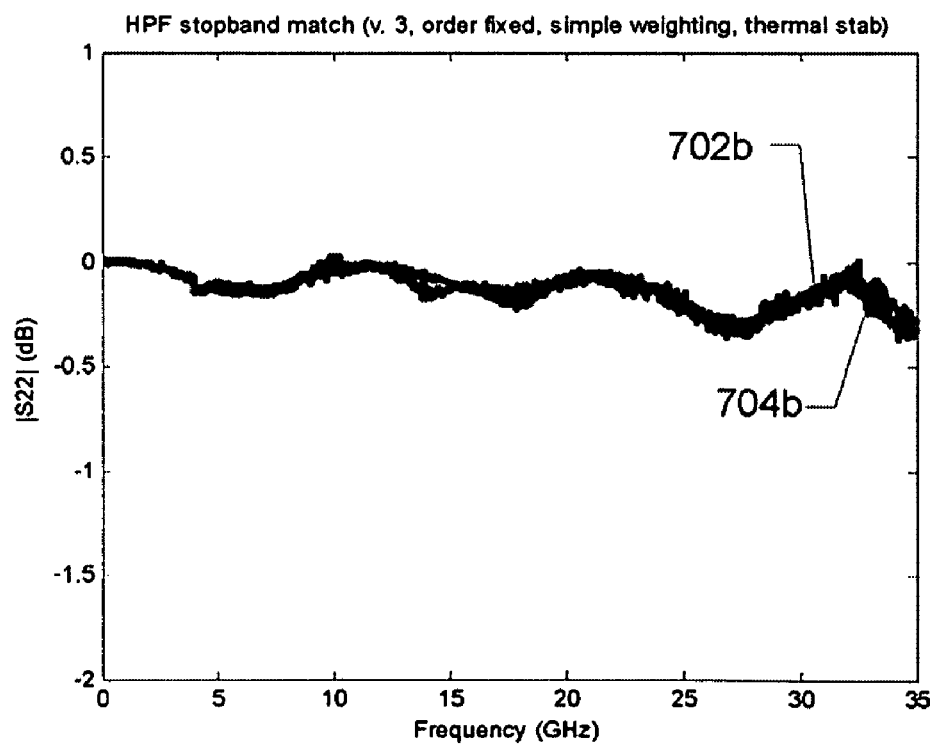

Finally, the overdetermined system of FIG. 3 was used, but with proximity-based weighting assignments and the agreement. The results (FIGS. 7A and 7B) are improved further. In FIGS. 7A and 7B, the curves 702 shows base calibration acquired data, and the curves 704 show the transfer calibration data acquired using embodiments of the present invention.

In summary, specific embodiments of the present invention, provide for a multiplexer-like switch topology to minimize electrical size and parasitic influence at high frequency, while providing the many required standards. Further, embodiments provide for extensibility to multiport calibration structures without additional switch layering. Also, embodiments of the present invention provide for the use of unique hybrid reflect-transmit standards structures. Embodiments of the present invention also relate to new multipass (i.e., iterative) calibration algorithms to accommodate the hybrid standards. Further, proximity-based uncertainty and weighting allocation is used, in accordance with certain embodiments, to improve accuracy. Such collection of items has allowed the creating of a simple, relatively reconfigurable, repeatable, high performance automatic calibration module capable of high quality transfer calibrations well beyond 50 GHz. In other words, provided above are new discrete switching topologies coupled with new processing algorithms, which allow calibration impedance states to be created simply and flexibly, with lower investment, and with high performance.

Many features of the present invention can be performed in, using, or with the assistance of hardware, software, firmware or combinations thereof. Consequently, many features of the present invention may be implemented using a processing system (e.g., including one or more processors). Such a processing system can be part of a VNA, or in communication with a VNA. In other words, certain features of the present invention can be implemented within a VNA, or other device that communicates with a VNA. Other features of the present invention relate to a physical calibration module structure. Still other features of the present invention relate to a VNA or other processing system controlling a calibration module of the present invention, e.g., to achieve various calibration impedances, and make various calibration measurements. For example, a controller (330 in FIG. 3, 430 in FIG. 4), e.g., implemented by a processor, state machine, or the like, can be used to selectively control the switches of the calibration modules. Such a controller can be within the calibration module, and/or within the VNA being calibrated, to provide for an autocalibration.

Features of the present invention, including algorithms of the present invention, can be implemented in, using, or with the assistance of a computer program product which is a storage medium (media) having instructions stored thereon/in which can be used to program a processing system to perform any of the features presented herein. The storage medium can include, but is not limited to ROMs, RAMs, EPROMs, EEPROMs, DRAMs, VRAMs, flash memory devices, or any type of media or device suitable for storing instructions and/or data.

Stored on any one of the machine readable medium (media), features of the present invention can be incorporated in software and/or firmware for controlling the hardware of a VNA and/or calibration module, and for enabling the VNA and calibration module to interact with one another. Such software and firmware may include, but is not limited to, application code, device drivers, operating systems and execution environments/containers.

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of functional building blocks illustrating the performance of specified functions and relationships thereof. The boundaries of these functional building blocks have often been arbitrarily defined herein for the convenience of the description. Alternate boundaries can be defined so long as the specified functions and relationships thereof are appropriately performed. Any such alternate boundaries are thus within the scope and spirit of the invention.

What is claimed is:

1. A calibration module for use in calibrating a vector network analyzer (VNA), the calibration module comprising:
   a plurality of ports connectable to a VNA;
   a plurality of calibration standards; and
   a plurality of single pole multi throw (SPMT) switches each of which includes
     a single pole terminal,
     multiple throw terminals,
     a shunt terminal corresponding to each of the multiple throw terminals, and
     a switching path between each of the throw terminals and the single pole terminal, and between each of the shunt terminals and the single pole terminal, wherein each of the switching paths include at least one solid state switching element;
   wherein the calibration standards are selectively connectable to the ports of the calibration module by selectively controlling the switching elements of the switching paths of the SPMT switches; and
   wherein each port of the calibration module is connected to one of the throw terminals of one of the SPMT switches without any intervening pole terminal.

2. The calibration module of claim 1, wherein the single pole terminal of each SPMT switch is connected internal to the calibration module.

3. The calibration module of claim 1, wherein a said single pole terminal of one of the SPMT switches is directly connected to a said single pole terminal of another one of the SPMT switches.

4. The calibration module of claim 1, wherein the plurality of single pole multi throw (SPMT) switches comprise single pole double throw (SPDT) switches.

5. The calibration module of claim 1, wherein the plurality of single pole multi throw (SPMT) switches include at least one single throw triple throw (SP3T) switch.

6. The calibration module of claim 1, wherein at least one of the calibrations standards is directly connected to a said shunt terminal of one of the SPMT switches.

7. The calibration module of claim 6, wherein a said calibration standard that is directly connected to a said shunt terminal is selectively connectable to a said port of the calibration module by selectively controlling a said switching element of a said switching path between the said shunt terminal and a corresponding said throw terminal.

8. The calibration module of claim 1, further comprising:
a controller to control the switching elements of the switching paths.

9. A method for use in calibrating a vector network analyzer (VNA), the method comprising:
selectively controlling single pole multi throw (SPMT) switches of a calibration module to thereby selectively provide transmission paths between calibration standards of the calibration module and one or more ports of a VNA;
wherein each SPMT includes a single pole terminal, multiple throw terminals, and a shunt terminal corresponding to each of the multiple throw terminals, wherein there is a switching path between each throw terminal and its corresponding shunt terminal; and
wherein the selectively controlling step includes providing one of the transmission paths between one of the calibration standards and one of the ports of the calibration module by connecting at least one of the shunt terminals in the transmission path.

10. The method of claim 9, wherein the SPMT switches comprise single pole double throw (SPDT) switches.

11. The method of claim 9, wherein the SPMT switches include at least one single throw triple throw (SP3T) switch.

12. A method for use in calibrating a vector network analyzer (VNA) including at least two ports, the method comprising:
(a) using a calibration module to produce a plurality of different calibration impedances and a thru connection, wherein at least one of the calibration impedances is achieved by using the calibration module to connect a first port of the VNA to a second port of the VNA using a first transmission path and, simultaneously, to connect the first port of the VNA to at least one calibration standard using a second transmission path;
(b) performing calibration measurements for the different calibration impedances and the thru connection; and
(c) determining values of calibration terms for the VNA based on the calibration measurements.

13. The method of claim 12, wherein the at least one of the calibration impedances that is achieved by using the calibration module to connect a first port of the VNA to a second port of the VNA and to at least one calibration standard, is a hybrid of a reflect standard and a transmission standard.

14. The method of claim 13, wherein:
step (a) includes using the calibration module to produce more than three different calibration impedances and the thru connection; and
step (b) includes performing overdetermined calibration measurements for the more than three different calibration impedances and the thru connection.

15. The method of claim 13, wherein step (c) includes:
(c.1) determining values for directivity, reflection and source match terms;
(c.2) determining values for load match and transmission terms;
(c.3) determining revised characterization values for each calibration impedance that is a hybrid of a reflect standard and a transmission standard; and
(c.4) repeating steps (c.1) and (c.2) using the revised characterization values determined at step (c.3).

16. The method of claim 15, wherein step (c) is repeated until error coefficients converge to a specified level.

17. The method of claim 15, wherein step (c.1) includes scaling equations used to determine values for directivity, reflection and source match terms.

18. The method of claim 17, wherein the scaling is based on uncertainties.

19. The method of claim 17, wherein the scaling is based on relative proximity of calibration standards used to provide the calibration impedances.

20. The method of claim 15, wherein step (c.3) includes using the following equations to determine the revised characterization values for each calibration impedance that is a hybrid of a reflect standard and a transmission standard:

$$S_{11}^{cc} = S_{11}^{c} + \frac{S_{21}^{c} \cdot S_{12}^{c} \cdot ep2L}{1 - S_{22}^{c} \cdot ep2L}$$

$$S_{22}^{cc} = S_{22}^{c} + \frac{S_{21}^{c} \cdot S_{12}^{c} \cdot ep1L}{1 - S_{11}^{c} \cdot ep1L}$$

where
the 'cc' superscripts denote the revised characterization values;
the 'c' superscripts denote characterization values measured with a parent calibration in place;
the S-parameters correspond to the thru connection; and
the ep1L and ep2L are values for load match terms determined at step (c.2).

* * * * *

UNITED STATES PATENT AND TRADEMARK OFFICE
CERTIFICATE OF CORRECTION

PATENT NO. : 7,924,024 B2  Page 1 of 1
APPLICATION NO. : 12/024916
DATED : April 12, 2011
INVENTOR(S) : Martens and Feldman It is certified that error appears in the above-identified patent and that said Letters Patent is hereby corrected as shown below:

In the title at item (54) and col. 1, line 1, after "CALIBRATION" insert --DEVICES AND--.

Signed and Sealed this
Twenty-sixth Day of July, 2011

David J. Kappos
*Director of the United States Patent and Trademark Office*